(12) United States Patent
Imaoka et al.

(10) Patent No.: US 10,421,622 B2
(45) Date of Patent: Sep. 24, 2019

(54) FLOATING CONVEYOR AND SUBSTRATE PROCESSING APPARATUS

(71) Applicant: SHIBAURA MECHATRONICS CORPORATION, Yokohama-shi (JP)

(72) Inventors: Yuichi Imaoka, Yokohama (JP); Akinori Iso, Yokohama (JP)

(73) Assignee: SHIBAURA MECHATRONICS CORPORATION, Yokohama-shi (JP)

( * ) Notice: Subject to any disclaimer, the term of this patent is extended or adjusted under 35 U.S.C. 154(b) by 0 days.

(21) Appl. No.: 15/856,665

(22) Filed: Dec. 28, 2017

(65) Prior Publication Data

US 2018/0178993 A1 Jun. 28, 2018

(30) Foreign Application Priority Data

Dec. 28, 2016 (JP) .................................. 2016-254564
Nov. 28, 2017 (JP) .................................. 2017-227757

(51) Int. Cl.

| B65G 49/06 | (2006.01) |
|---|---|
| B65G 9/00 | (2006.01) |
| B65G 49/07 | (2006.01) |
| H01L 21/677 | (2006.01) |
| C03C 21/00 | (2006.01) |
| B65G 51/03 | (2006.01) |

(52) U.S. Cl.
CPC ........... *B65G 49/063* (2013.01); *B65G 9/002* (2013.01); *B65G 49/065* (2013.01); *B65G 49/069* (2013.01); *B65G 49/07* (2013.01); *C03C 21/001* (2013.01); *H01L 21/677* (2013.01); *H01L 21/67784* (2013.01); *B65G 51/03* (2013.01); *B65G 2249/045* (2013.01); *B65G 2812/16* (2013.01)

(58) Field of Classification Search
CPC .. B65G 49/063; B65G 49/065; B65G 49/069; B65G 49/07; B65G 9/002; B65G 2249/045; B65G 2812/16; C03C 21/001; H01L 21/677
USPC .............. 414/676; 65/17.1; 198/493; 406/88
See application file for complete search history.

(56) References Cited

U.S. PATENT DOCUMENTS

| 6,220,056 B1 * | 4/2001 | Ostendarp ............ B65G 49/065 65/175 |
|---|---|---|
| 6,584,991 B1 * | 7/2003 | Ries ....................... A23N 12/02 134/122 R |
| 6,781,684 B1 * | 8/2004 | Ekhoff ................. B65G 49/061 356/237.1 |

(Continued)

FOREIGN PATENT DOCUMENTS

| JP | 2920500 B2 | 4/1999 |
|---|---|---|
| JP | 2011-84352 | 4/2011 |

(Continued)

*Primary Examiner* — Lynn E Schwenning
(74) *Attorney, Agent, or Firm* — Oblon, McClelland, Maier & Neustadt, L.L.P.

(57) ABSTRACT

According to one embodiment, a floating conveyor is configured to convey a substrate while floating the substrate. The floating conveyor includes a lower floating section and an upper floating section with a conveying path of the substrate therebetween. A plurality of floating blocks that constitute at least one of the lower floating section and the upper floating section are arranged to be separated by a space, and a floating block that constitutes the other is arranged to face the space.

10 Claims, 3 Drawing Sheets

(56) References Cited

U.S. PATENT DOCUMENTS

| | | | | |
|---|---|---|---|---|
| 7,128,516 B2 * | 10/2006 | Sugiyama | ............ | B65G 47/252 |
| | | | | 414/676 |
| 8,225,924 B2 * | 7/2012 | Isobe | .................... | B65G 37/00 |
| | | | | 198/468.5 |
| 2007/0195653 A1 | 8/2007 | Yassour et al. | | |
| 2018/0033697 A1 * | 2/2018 | Suzuki | .................. | H01L 21/677 |

FOREIGN PATENT DOCUMENTS

| | | |
|---|---|---|
| JP | 2014-47020 | 3/2014 |
| JP | 2016-161007 A | 9/2016 |
| KR | 10-2010-0123196 A | 11/2010 |
| TW | 201601850 A | 1/2016 |

* cited by examiner

FLOATING CONVEYOR AND SUBSTRATE PROCESSING APPARATUS

CROSS-REFERENCE TO THE RELATED APPLICATION

This application is based upon and claims the benefit of priority from Japanese Patent Applications No. 2016-254564, filed on Dec. 28, 2016 and No. 2017-227757, filed on Nov. 28, 2017; the entire contents of all of which are incorporated herein by reference.

FIELD

Embodiments described herein relate generally to a floating conveyor and a substrate processing apparatus.

BACKGROUND

In a liquid crystal manufacturing apparatus or the like, a floating conveyor configured to convey a glass substrate while floating it is used in some cases.

As an example of the floating conveyor is known the one that is provided with a plurality of gas ejection holes and gas suction holes on the surface of the floating block, and conveys a substrate while floating the substrate from the floating block by adjusting the amount of gas ejected from each of the ejection holes and the amount of gas suctioned by each of the suction holes. The gas ejection amount and suction amount are determined in consideration of the weight of the substrate to be conveyed, the floating distance from the surface of the floating block, and the like. As the size of the substrate increases, a plurality of floating blocks are arranged along the conveying direction of the substrate and the direction perpendicular to the conveying direction.

There is a case where a treatment liquid is applied to the substrate being conveyed to treat the substrate. Therefore, in order to secure a space for arranging a nozzle or the like for supplying the treatment liquid, the floating blocks are arranged such that adjacent two are spaced apart from each other.

If there is a space between adjacent floating blocks, no floating force exists for the substrate in the space portion. As a result, the leading end of the substrate being conveyed sometimes bends and collides with the floating block. The thinner the substrate is, the more this occurs conspicuously. There may even be a case where the conveyance of the substrate has to be interrupted.

DETAILED DESCRIPTION

According to one embodiment, a floating conveyor is configured to convey a substrate while floating the substrate. The floating conveyor includes a lower floating section and an upper floating section with a conveying path of the substrate therebetween. A plurality of floating blocks that constitute at least one of the lower floating section and the upper floating section are arranged to be separated by a space, and a floating block that constitutes the other is arranged to face the space.

According to another embodiment, a substrate processing apparatus is configured to process a substrate while floating and conveying the substrate. The substrate processing apparatus includes: a floating conveyor including a floating section configured to float the substrate, and a conveying force imparting section configured to convey the substrate floated and supported by the floating section in a conveying direction; and a treatment fluid supply section configured to supply treatment fluid to the substrate that is conveyed while being floated by the floating conveyor. The floating conveyor is the floating conveyor described above.

A substrate processing apparatus according to embodiments will be described hereinafter with reference to the accompanying drawings.

Figure 1:
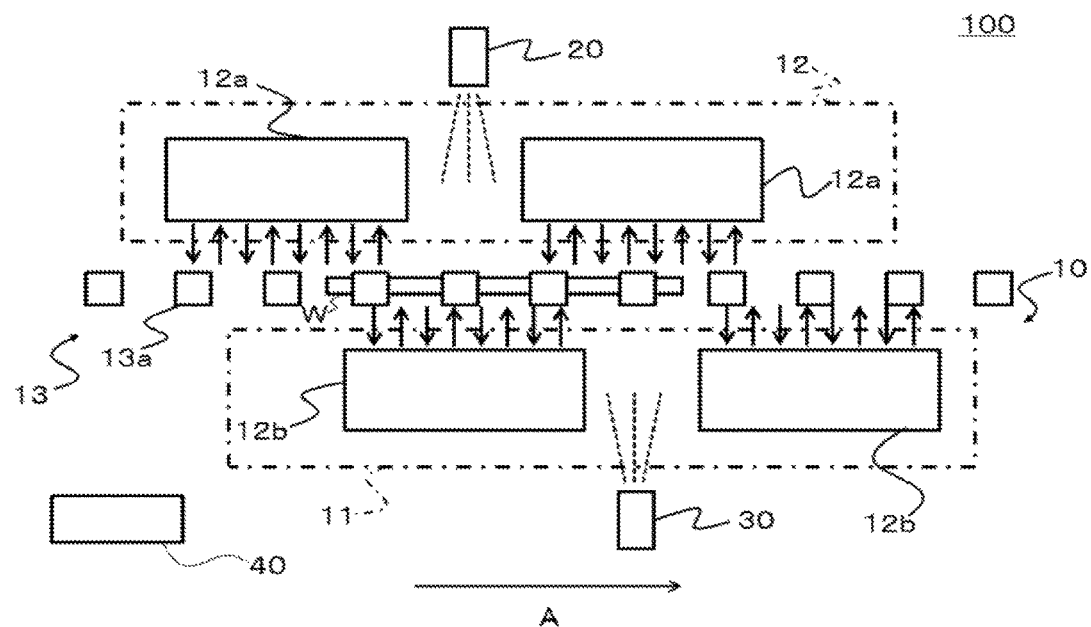
FIG. 1 is a front view schematically illustrating a substrate processing apparatus according to a first embodiment.

As illustrated in FIG. 1, a substrate processing apparatus 100 of the embodiment includes a floating conveyor 10 and treatment liquid supply devices (treatment fluid supply sections) 20 and 30. The floating conveyor 10 includes a lower floating device (a lower floating section) 11 and an upper floating device (an upper floating section) 12 with respect to the conveying path of a substrate W as a boundary, and a conveying force imparting mechanism (a conveying force imparting section) 13.

As the lower floating device 11 and the upper floating device 12, known floating blocks, which are configured to make the substrate W float by ejection and suction of gas such as air from the surface, are used.

Figure 2:
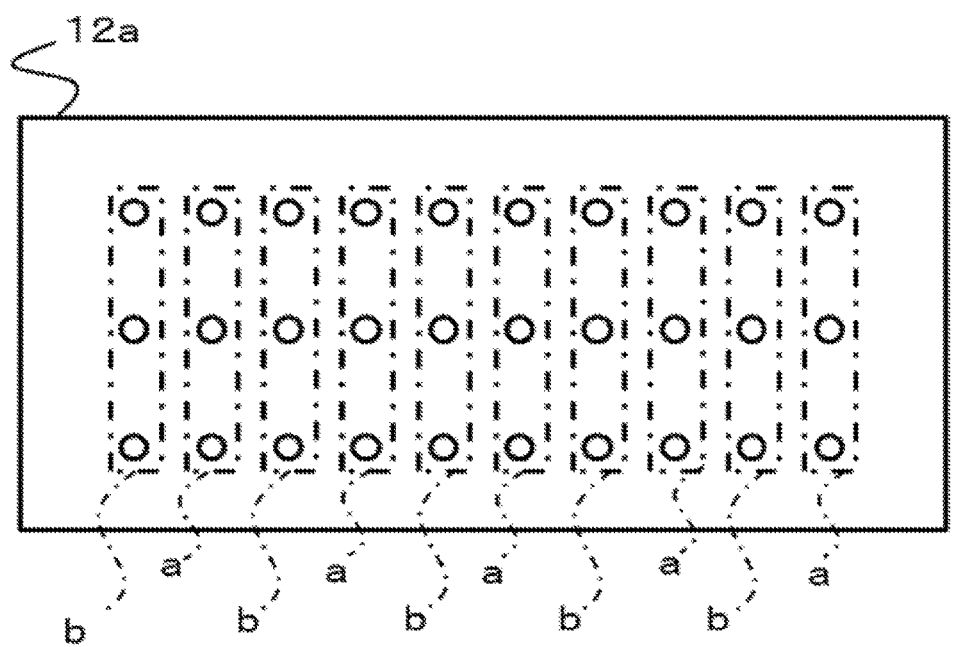
FIG. 2 is a schematic bottom view of a floating block of the substrate processing apparatus illustrated in FIG. 1.
Figure 3:
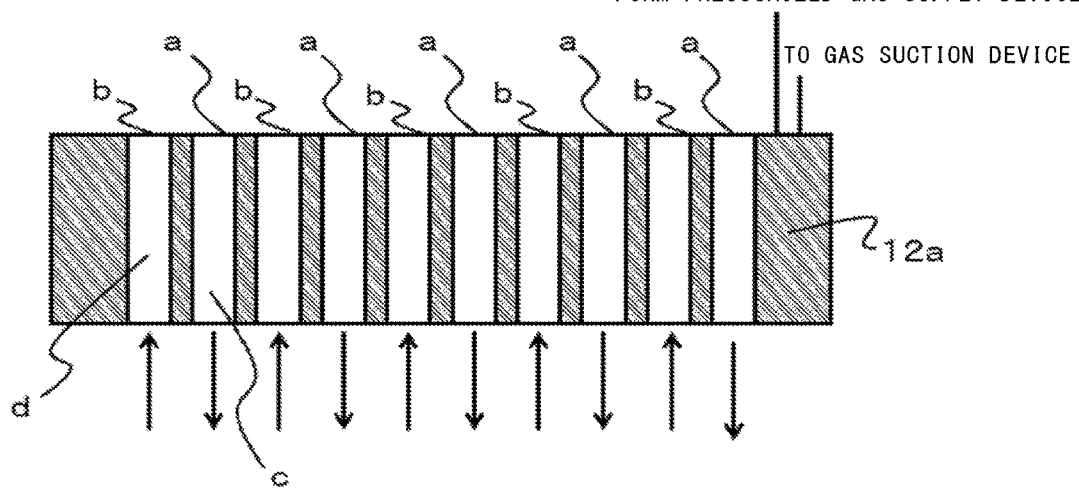
FIG. 3 is a schematic partial cross-sectional view of the floating block illustrated in FIG. 2.

FIG. 2 illustrates a schematic bottom view of one of floating blocks 12a that constitutes the upper floating device 12. FIG. 3 illustrates a schematic partial cross-sectional view of the floating block 12a, in particular the portion of ejection holes and suction holes. The floating block 12a has a rectangular parallelepiped shape, and includes ejection holes a and suction holes b regularly aligned on the lower surface. The floating block 12a is configured to float and support the substrate W passing below it by the balance of air ejected from the ejection holes a, air sucked from the suction holes b, the weight of the substrate W, and the like. In FIG. 2, reference letters a and b denote the regions (indicated by alternate long and short dashed lines) where the ejection holes a and the suction holes b are arranged, respectively. That is, in each region indicated by the alternate long and short dashed line, the ejection holes a or the suction holes b (indicated by circles in FIG. 2) are arranged. Besides, in FIG. 3, the arrows indicate the air flow direction. As illustrated in FIG. 1, the floating blocks 12a constituting the upper floating device 12 are located above the conveyance surface of the substrate W. The floating blocks 12a are arranged in such a manner that known floating blocks 12b located just below the conveyance surface of the substrate W are turned upside down. Each of the ejection holes a of the floating blocks 12a and 12b is connected to a pressurized gas supply device (not illustrated) such as a blower or a compressor via a passage c or a filter (not illustrated). Each of the suction holes b is connected to a gas suction device (not illustrated) such as a pump (not illustrated) via a passage d. It is known that each of the floating blocks 12a and 12b can float the substrate W by the action of gas ejected from the ejection holes a, and apply floating rigidity by the suction effect from the suction holes b.

In the embodiment, the plurality of floating blocks 12b constituting the lower floating device 11 and the plurality of floating blocks 12a constituting the upper floating device 12 are arranged with the conveying path (conveyance surface) of the substrate W therebetween according to the conveying force imparting mechanism 13 described later in an arrangement relationship as follows. In FIG. 1, the two floating blocks 12b constituting the lower floating device 11 and the two floating blocks 12a constituting the upper floating device 12 are arranged along the conveying direction A of the substrate W. The two floating blocks 12b constituting the lower floating device 11 are spaced apart and the two floating blocks 12a constituting the upper floating device 12 are spaced apart similarly, in the conveying direction A of the substrate W. Specifically, the both are separated by a space where the treatment liquid supply device 20, 30 can be arranged. As illustrated in FIG. 1, it suffices if the space has a size that allows at least the treatment liquid supply device 20, to supply a treatment liquid to the substrate W. One of the two floating blocks 12a constituting the upper floating device 12 faces the space between the two floating blocks 12b constituting the lower floating device 11. Further, the space between the two floating blocks 12a constituting the upper floating device 12 faces any one of the two floating blocks 12b constituting the lower floating device 11. The distance between the lower surface of the floating blocks 12a and the upper surface of the floating blocks 12b is, for example, 5 mm or less. The length of the substrate W in the conveying direction A is longer than the space between the pair of floating blocks 12a and the space between the pair of floating blocks 12b.

Figure 4:
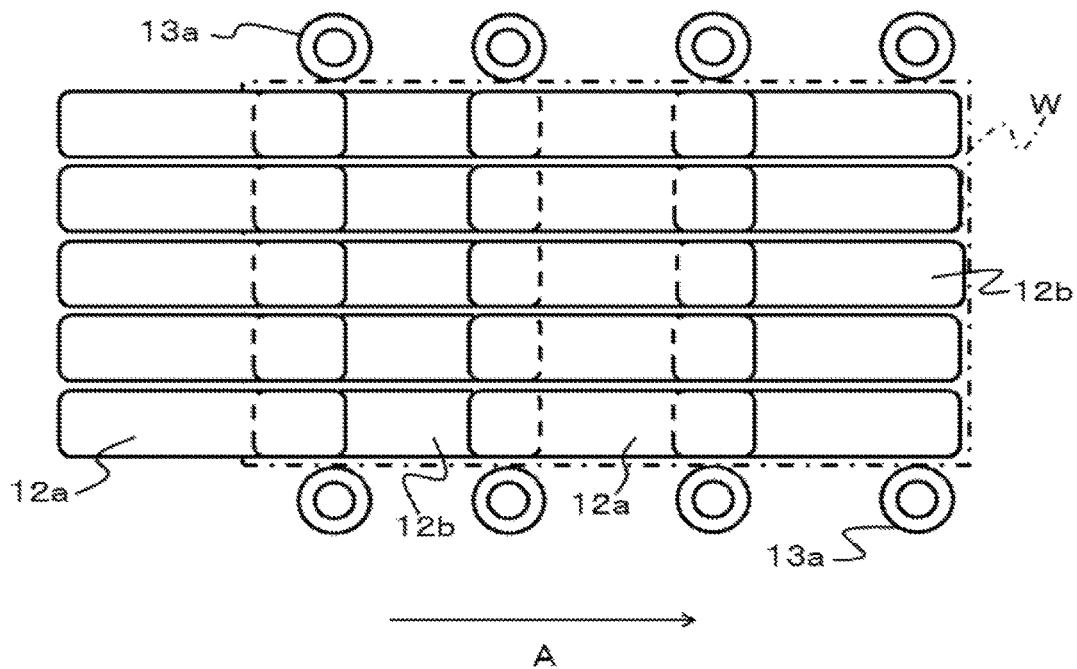
FIG. 4 is a plan view of the substrate processing apparatus illustrated in FIG. 1.

The arrangement relationship between the floating blocks 12a and 12b of the upper floating device 12 and the lower floating device 11 has been described above with reference to FIG. 1; however, in the embodiment, in addition to the floating blocks 12a and 12b arranged in the conveying direction A of the substrate W, a plurality of floating blocks (five in the embodiment) may be arranged in a direction perpendicular to the conveying direction A (hereinafter referred to as "width direction") according to the size of the substrate W to be conveyed as illustrated in FIG. 4. In this case, the above-described space is also formed along the width direction in addition to the conveying direction A. The length in the width direction can be set freely by adjusting the number of the floating blocks 12a and 12b according to the size of the substrate W. In FIG. 4, the treatment liquid supply devices 20 and 30 and a controller 40 are omitted.

The conveying force imparting mechanism 13 conveys the substrate W held in a non-contact state (floating state) with respect to the floating blocks 12a and 12b in the conveying direction A. Specifically, as illustrated in FIG. 4, the conveying force imparting mechanism 13 includes rollers 13a that come in contact with the side surface of the substrate W along the conveying direction A. Each of the rollers 13a is configured to be driven to rotate by a driving device (not illustrated). By the rotation of the rollers 13a, a conveying force in the direction A is applied to the floating substrate W.

In FIG. 1, the treatment liquid supply devices 20 and 30 are configured to supply a treatment liquid (for example, pure water) for treating the substrate W to the surface of the substrate W. The treatment liquid supply device 20 is arranged in a space formed between the two floating blocks 12a constituting the upper floating device 12, and supplies a treatment liquid to the front surface (upper surface) of the substrate W passing under it through, for example, a nozzle. Meanwhile, the treatment liquid supply device 30 is arranged in a space formed between the two floating blocks 12b constituting the lower floating device 11, and supplies a treatment liquid to the back surface (lower surface) of the substrate W passing above it through, for example, a nozzle. In the case of FIG. 4, the treatment liquid supply devices 20 and 30 include, for example, a slit nozzle so that the treatment liquid can be supplied to the entire region in the width direction of the substrate W conveyed. The slit of the slit nozzle extends along the width direction of the substrate W and has at least a dimension in the width direction of the substrate W. The treatment liquid is ejected from the slit nozzle and supplied to the front and back surfaces (upper and lower surfaces) of the substrate W conveyed.

Described below is the treatment process of the substrate W by the substrate processing apparatus 100. Note that the operation described below is controlled by the controller 40.

First, in the floating blocks 12a and 12b, the operation of ejecting air from the ejection holes a and the operation of sucking air from the suction holes b are started. When the substrate W is carried into the substrate processing apparatus 100, the substrate W is floated and supported by the floating blocks 12a and 12b depending to the action of the floating conveyor 10, and is conveyed in the direction A by the rotational force of the rollers 13a. When the substrate W reaches the arrangement position of the treatment liquid supply device 20, a treatment liquid is supplied to the front surface (upper surface) of the substrate W from a slit nozzle (not illustrated). When the substrate W reaches the arrangement position of the treatment liquid supply device 30, the treatment liquid is supplied to the back surface (lower surface) of the substrate W from a slit nozzle (not illustrated). Then, after the front and back surfaces are treated by the treatment liquid supply devices 20 and 30, the substrate W is carried out of the substrate processing apparatus 100 and conveyed to the next step by a conveyor mechanism (not illustrated).

Incidentally, in FIG. 1, the substrate W carried into the substrate processing apparatus 100 is floated and supported by the floating block 12a on the carry-in side. In FIG. 1, when the leading end of the substrate W reaches the space between the two floating blocks 12a constituting the upper floating device 12, none of the floating blocks 12a faces the leading end of the substrate W. However, as described above, the space between the two floating blocks 12a constituting the upper floating device 12 faces any one of the two floating blocks 12b constituting the lower floating device 11. Thus, in FIG. 1, a floating force is applied to the leading end portion of the substrate W which has reached the space between the adjacent floating blocks 12a, by the floating block 12b of the lower floating device 11. A floating force is also applied to the portion of the substrate W conveyed that faces the space between the adjacent floating blocks 12a, by the floating block 12b.

When the leading end of the substrate W reaches the space between the two floating blocks 12b constituting the lower floating device 11, none of the floating blocks 12b faces the leading end of the substrate W. However, as described above, the space between the two floating blocks 12b constituting the lower floating device 11 faces any one of the two floating blocks 12a constituting the upper floating device 12. Thus, in FIG. 1, a floating force is applied to the leading end portion of the substrate W that has reached the space between the adjacent floating blocks 12b, by the floating block 12a of the upper floating device 12. A floating force is also applied to the portion of the substrate W conveyed that faces the space between the adjacent floating blocks 12b, by the floating block 12a.

In the embodiment, a space is provided between the floating blocks 12a and between the floating blocks 12b to arrange the treatment liquid supply devices 20 and 30. The floating blocks 12a constituting the upper floating device 12 are arranged so as to face the space between the two floating blocks 12b constituting the lower floating device 11. The floating blocks 12b constituting the lower floating device 11 are arranged so as to face the space between the two floating blocks 12a constituting the upper floating device 12. Thereby, a floating force is also applied to the substrate W even while the substrate W is passing through the space. In particular, the floating force is continuously applied to the portion of the substrate W conveyed that is passing through the space. This prevents such an event that the substrate W conveyed, particularly the leading end thereof, is deformed in the space formed between the adjacent floating blocks 12a (12b) by its own weight or the pressure of the treatment liquid supplied from the treatment liquid supply device 20 (30) and, for example, the deformed leading end collides with the floating block 12b and is damaged, the work is interrupted and the work efficiency is lowered, or the conveyance is continued with the deformed leading end and the treatment is not performed uniformly.

Figure 5:
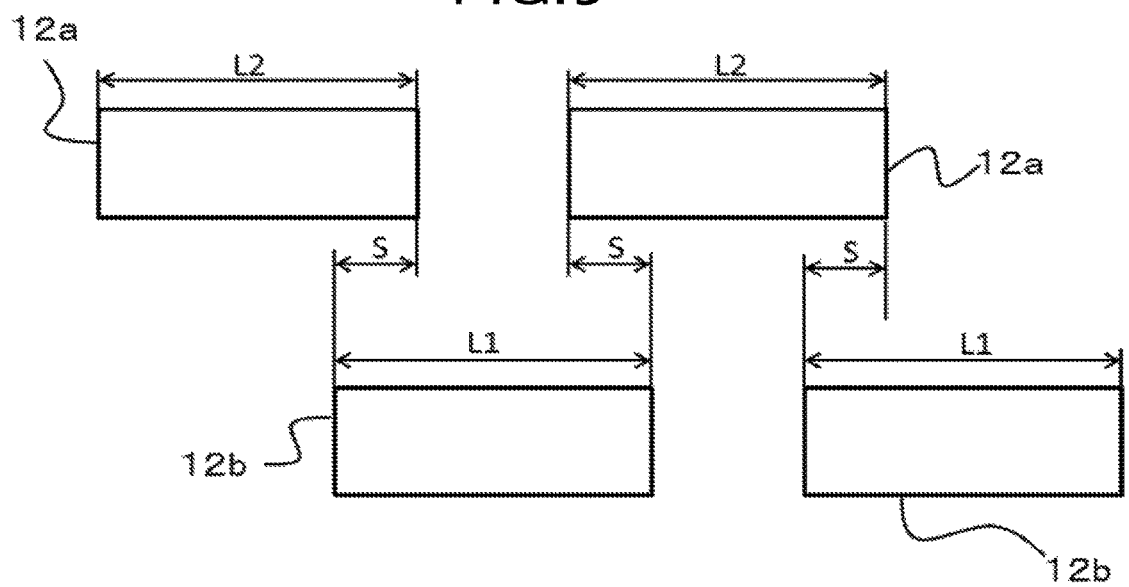
FIG. 5 is a front view of the floating block illustrated in FIG. 1.

In the following, the relationship of the lengths of the floating blocks 12a and 12b (Example 1 to Example 3) will be described with reference to FIG. 5. In FIG. 5, L2 indicates the length of the floating block 12a in the conveying direction A, L1 indicates the length of the floating block 12b in the conveying direction A, and S indicates the length of overlap between the floating block 12a and the floating block 12b in the conveying direction A.

In Example 1, L2=L1. In this case, the same blocks can be used as the upper and lower floating blocks 12a and 12b. In Example 2, L2=L1 as in Example 1, and S=0 or more and [L1 (=L2)/2] or less. All the Ss need not be the same value. In Example 3, L2=L1×(1 or more and 2 or less). Such a relationship of the lengths is provided by way of example only without limitation.

Further, in the embodiment, the conveying force with respect to the substrate W floated and supported by the floating blocks 12a and 12b is obtained from the rotational force of the rollers 13a. However, the conveying force may be obtained by, for example, tilting the direction of air ejected from the ejection holes a of the floating blocks 12a and 12b in the conveying direction A of the substrate W. In this case, there may be no roller 13a, or this may be used in combination with the rollers 13a.

Although it has been described that air is ejected from the ejection holes a of the floating blocks 12a and 12b, inert gas such as helium may be ejected instead of air or a liquid such as pure water may be ejected instead of gas.

In the embodiment illustrated in FIG. 1, in order to supply a treatment liquid to the upper and lower surfaces of the substrate W, a space is formed between the floating blocks 12b constituting the lower floating device 11 and between the floating blocks 12a constituting the upper floating device 12. However, for example, if the treatment liquid is supplied only to the lower surface of the substrate W, there is no need to form a space between the floating blocks 12a constituting the upper floating device 12. That is, in FIG. 1, for example, when a space is formed between floating blocks constituting at least one of the lower floating device 11 and the upper floating device 12, it is only required that the floating block constituting the other floating device is arranged so as to face the space.

In the above embodiment, the treatment liquid supply device 20, 30 that supply a treatment liquid to the substrate W are employed as treatment fluid supply sections; however, it is not so limited. The treatment fluid supply section may be gas supply devices or two-fluid supply devices that supply liquid and gas.

In the above embodiment, a space is provided between the floating blocks 12a and between the floating blocks 12b that constitute the lower floating device 11 and the upper floating device 12, respectively. This is to arrange the treatment liquid supply device 20, 30 in the space. However, the reason for providing a space between the floating blocks along the conveying direction of the substrate W is not limited to that. For example, when the substrate W is conveyed between a cleaning device and a drying device adjacent to each other, a space may be provided between the adjacent floating blocks in the connecting portion of the devices. There may be any other reason.

What is claimed is:

1. A floating conveyor configured to convey a substrate while floating the substrate, comprising:
   a lower floating member and an upper floating member with a conveying path of the substrate therebetween, the lower floating member and the upper floating member each including a plurality of floating block members, each of which has ejection holes for ejecting fluid and suction holes for sucking the fluid in a surface facing the substrate being conveyed,
   wherein the floating block members that constitute each of the lower floating member and the upper floating member are arranged to be separated by a space in a conveying direction of the substrate,
   wherein any of the floating block members of the upper floating member faces the space between the floating block members of the lower floating member, and any of the floating block members of the lower floating member faces the space between the floating block members of the upper floating member, and
   wherein the space between the floating block members of the lower floating member and the space between the floating block members of the upper floating member do not face each other.

2. The floating conveyor of claim 1, wherein the floating block member of the lower floating member and the floating block member of the upper floating member have a same length in the conveying direction of the substrate.

3. The floating conveyor of claim 1, wherein a length of overlap of the floating block member of the upper floating member and the floating block member of the lower floating member in the conveying direction of the substrate is a half of a length of the floating block member of the lower floating member in the conveying direction of the substrate or less.

4. The floating conveyor of claim 1, wherein each of the lower floating member and the upper floating member further includes a plurality of floating block members arranged in a direction perpendicular to the conveying direction of the substrate.

5. A substrate processing apparatus configured to process a substrate while floating and conveying the substrate, the apparatus comprising:
   a floating conveyor including a floating member configured to float the substrate, and a conveying force imparting member configured to convey the substrate floated and supported by the floating member in a conveying direction; and
   a treatment fluid supplier configured to supply treatment fluid to the substrate that is conveyed while being floated by the floating conveyor, wherein the floating member includes a lower floating member and an upper floating member with a conveying path of the substrate therebetween, the lower floating member and the upper floating member each including a plurality of floating block members, each of which has ejection holes for ejecting fluid and suction holes for sucking the fluid in a surface facing the substrate being conveyed, wherein the floating block members that constitute each of the lower floating member and the upper floating member are arranged to be separated by a space in a conveying direction of the substrate, wherein any of the floating block members of the upper floating member faces the space between the floating block members of the lower floating member, and any of the floating block members of the lower floating member faces the space between the floating block members of the upper floating member, and wherein the space between the floating block members of the lower floating member and the space between the floating block members of the upper floating member do not face each other.

6. The substrate processing apparatus of claim 5, wherein the floating block member of the lower floating member and the floating block member of the upper floating member have a same length in the conveying direction of the substrate.

7. The substrate processing apparatus of claim 5, wherein a length of overlap of the floating block member of the upper floating member and the floating block member of the lower floating member in the conveying direction of the substrate is a half of a length of the floating block member of the lower floating member in the conveying direction of the substrate or less.

8. The substrate processing apparatus of claim 5, wherein each of the lower floating member and the upper floating member further includes a plurality of floating block members arranged in a direction perpendicular to the conveying direction of the substrate.

9. The substrate processing apparatus of claim 5, wherein the lower floating member and the upper floating member each includes two floating block members, and wherein the space between the two floating block members of the lower floating member is located downstream of the space between the two floating block members of the upper floating member in the conveying direction of the substrate.

10. The substrate processing apparatus of claim 9, wherein the treatment fluid supplier includes a first supply nozzle arranged in the space of the upper floating member and configured to supply the treatment fluid to an upper surface of the substrate conveyed by the conveying force imparting member, and a second supply nozzle arranged in the space of the lower floating member and configured to supply the treatment fluid to a lower surface of the substrate conveyed by the conveying force imparting member.

* * * * *